(12) United States Patent
Nakamura

(10) Patent No.: US 6,236,904 B1
(45) Date of Patent: May 22, 2001

(54) SUBSTRATE CONVEYING SYSTEM

(75) Inventor: Gen Nakamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/257,929

(22) Filed: Feb. 26, 1999

(30) Foreign Application Priority Data

Feb. 27, 1998 (JP) .................................................. 10-061902

(51) Int. Cl.⁷ ...................................................... G06F 7/00
(52) U.S. Cl. ........................ 700/218; 901/9; 414/331.14; 414/331.18; 414/937
(58) Field of Search ................................... 700/213, 218, 700/108, 110, 112, 113, 253, 255, 258; 901/9, 47; 414/331.14, 331.18, 937

(56) References Cited

U.S. PATENT DOCUMENTS

| | | | |
|---|---|---|---|
| 3,945,505 | * 3/1976 | Frisbie et al. ............................... | 214/1 |
| 4,694,186 | 9/1987 | Onoda et al. ............................. | 250/578 |
| 4,803,373 | * 2/1989 | Imamura et al. ........................ | 414/331 |
| 4,819,167 | * 4/1989 | Cheng et al. .................... | 364/167.01 |
| 4,895,486 | * 1/1990 | Baker et al. ........................... | 414/331 |
| 4,900,212 | * 2/1990 | Mikahara .............................. | 414/416 |
| 5,239,182 | * 8/1993 | Tateyama et al. .................... | 414/331 |
| 5,540,098 | * 7/1996 | Ohsawa .................................... | 73/629 |
| 5,604,443 | * 2/1997 | Kitamura et al. ..................... | 324/754 |
| 5,642,978 | * 7/1997 | Lahne et al. ........................ | 414/331 |
| 5,685,684 | * 11/1997 | Kato et al. ............................ | 414/217 |
| 5,700,127 | * 12/1997 | Harada et al. ........................ | 414/416 |
| 5,740,052 | 4/1998 | Nakamura ....................... | 364/468.28 |
| 5,740,059 | * 4/1998 | Hirata et al. ..................... | 364/478.01 |
| 5,813,819 | * 9/1998 | Ohsawa et al. ...................... | 414/416 |
| 5,906,469 | * 5/1999 | Oka et al. ............................ | 414/416 |
| 5,909,994 | * 6/1999 | Blum et al. ........................... | 414/217 |
| 6,013,920 | * 1/2000 | Gordon et al. .................. | 250/559.36 |

* cited by examiner

Primary Examiner—Joseph E. Valenza
Assistant Examiner—Khoi H. Tran
(74) Attorney, Agent, or Firm—Fitzpatrick, Cella, Harper & Scinto

(57) ABSTRACT

A conveying system for conveying a substrate is provided with a sensor for measuring information related to flexure of the substrate during conveyance or the vertical position of the substrate. Conveyance of the substrate is controlled on the basis of the measurement by the sensor, whereby correct conveyance of the substrate is accomplished without being influenced by dispersive flexure amount of substrate.

30 Claims, 8 Drawing Sheets

SUBSTRATE CONVEYING SYSTEM

FIELD OF THE INVENTION AND RELATED ART

This invention relates to a substrate conveying system for conveying a substrate such as a semiconductor wafer or a liquid crystal plate, for example. More particularly, the invention is concerned with a substrate conveying system suitably usable in semiconductor manufacturing apparatuses such as a semiconductor exposure apparatuses, for example, for conveying a semiconductor wafer.

With increases in efficiency of semiconductor device manufacture, the size of a wafer to be used in a semiconductor exposure apparatus is being enlarged. As regards wafers to be used in such semiconductor exposure apparatus, the size has increased from conventional 6-inch wafer to 8-inch wafer and then to 12-inch wafer. Also, the size of conveying system for conveying wafers is being enlarged.

In the stream of enlargement in size of the wafer or wafer conveying system, problems such as flexure or distortion of wafer during conveyance have arisen from enlargement of wafer size. More specifically, when a large-size wafer is conveyed by using a conventional conveying system, flexure of the wafer itself may occur which, when the wafer is to be transported to a wafer carrier, for example, may cause interference between the edge of the wafer and the wafer carrier, resulting in breakage of the carrier or wafer. In order to avoid this problem, conventionally, the amount of wafer flexure is predicted and the wafer carrier is shifted vertically beforehand by an offset of an amount corresponding to the flexure of the wafer.

In this procedure, the wafer carrier is shifted vertically beforehand by an amount of offset corresponding to the amount of wafer flexure to thereby prevent interference. However, the wafer flexure is dispersive and, therefore, it is not easy to completely prevent interference between the wafer and the wafer carrier. Such interference may cause damage of the wafer or malfunction of the mechanism, resulting in breakdown of the apparatus. It needs repair work by an operator, which directly leads to a decrease of operation efficiency of the apparatus.

Similar problems may arise in apparatuses using substrates other than semiconductor wafers, such as liquid crystal plates for manufacture of liquid crystal display panels, for example.

SUMMARY OF THE INVENTION

It is accordingly an object of the present invention to provide a substrate conveying system by which, even if substrates such as semiconductor wafers or liquid crystal plates have dispersive flexure, they can be conveyed properly, by which malfunction of an apparatus or the need of repair work and maintenance load can be reduced, and by which the throughput and productivity of the apparatus can be enlarged.

In accordance with an aspect of the present invention, there is provided a substrate conveying system, comprising: a conveying mechanism for conveying a substrate; a sensor for producing positional information related to the substrate during conveyance of the substrate; and control means for controlling the substrate conveying operation on the basis of the produced information.

The substrate conveying operation may preferably be stopped in accordance with the information.

Said sensor may be serviceable to detect a maximum amount and a minimum amount of flexure of the substrate, and the substrate conveying operation may be stopped when a difference between these amounts becomes larger than a predetermined value.

The substrate conveying operation may be controlled in accordance with the information and data as specified by the operator.

The substrate conveying operation may be controlled in accordance with the information and data supplied from a superior host control means of said substrate conveying system.

Said control means may be operable to adjust relative positional relation between the substrate and substrate transfer means.

Said conveying mechanism may move the substrate in a lateral direction.

The substrate and the substrate transfer means may be relatively moved relative to each other, in a longitudinal direction, in accordance with the information.

The conveying mechanism may move the substrate in a longitudinal direction.

The substrate transfer means may be movable in a longitudinal direction.

The substrate transfer means may comprise a carrier for accommodating plural wafers therein.

The sensor may be disposed adjacent the substrate transfer means.

The sensor may be movable in a longitudinal direction.

The sensor may comprise a line sensor, or an optical sensor.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
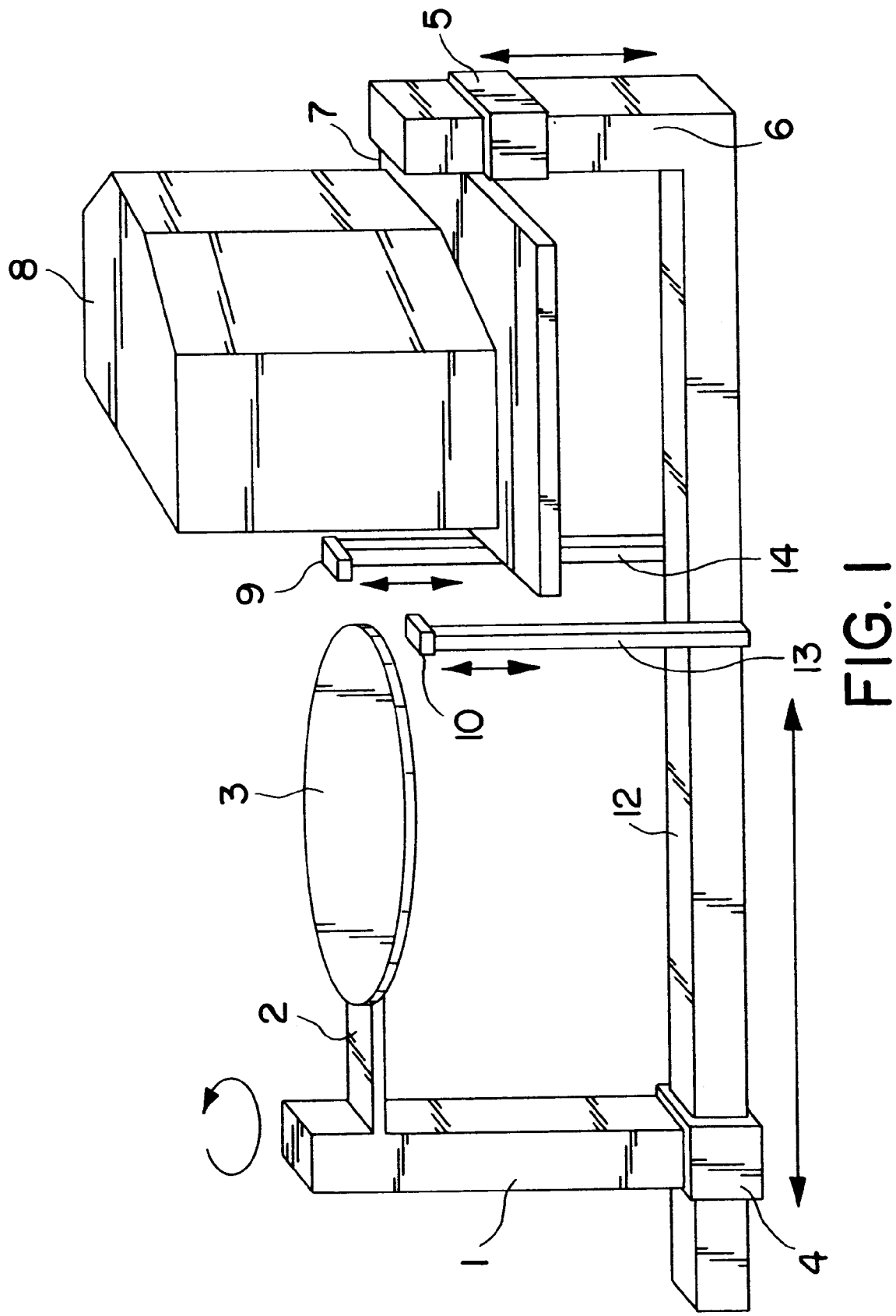
FIG. 1 is a perspective view of a main portion of a semiconductor manufacturing apparatus according to a first embodiment of the present invention.

A substrate conveying system according to an embodiment of the present invention comprises a sensor for detecting an end face of a substrate and being movable in a longitudinal or vertical direction, a substrate conveying hand mechanism having a function for moving a substrate in a lateral or horizontal direction, and a CPU for performing measurement process with respect to the vertical direction in synchronism with the motion of the substrate in horizontal direction.

In the structure described above, when the substrate conveying hand starts its movement in horizontal direction, the sensor for detecting the end face of the substrate moves in vertical direction until it detects the substrate. When the end face detecting sensor detects the edge of the substrate, the output of the sensor is applied to a control CPU whereby the position of the substrate with respect to the vertical direction is calculated. The CPU then compares the information on the sensor position with respect to the vertical direction, with predetermined positional information. If the position is concluded as interference position, a position stopping signal is applied to the conveying system. Because of this signal, the interference between the substrate and the substrate transfer means or substrate container means is prevented, and the operation efficiency and productivity of the apparatus are improved. Here, the substrate may be a semiconductor wafer, for example, and the substrate transfer means or the substrate container means may be a wafer carrier, for example.

A substrate conveying system according to another embodiment of the present invention comprises a sensor for detecting an end face of a substrate and being movable in a longitudinal or vertical direction, a substrate conveying hand mechanism having a function for moving a substrate in a lateral or horizontal direction, a substrate container means being movable in vertical direction, and a CPU for performing synchronization control for the motion of the substrate conveying hand in the horizontal direction and the motion of the substrate container means in the vertical direction.

In the structure described above, when the substrate conveying hand starts its movement in horizontal direction, the sensor for detecting the end face of the substrate moves in vertical direction until it detects the substrate. When the end face detecting sensor detects the edge of the substrate, the output of the sensor is applied to a control CPU whereby the position of the substrate with respect to the vertical direction is calculated. Simultaneously therewith, the CPU reads the information about the sensor position with respect to vertical direction, and moves the substrate container means to a position not interfering with the substrate. The substrate detection described above is performed during movement of the substrate conveying hand, and the substrate container means is moved to a position not interfering with the substrate. As a result, the interference between the substrate and the substrate container means is prevented, and the operation efficiency and productivity of the apparatus is improved.

Preferred embodiments of the present invention will now be described with reference to the accompanying drawings.

[First Embodiment]

FIG. 1 is a schematic view of a semiconductor manufacturing apparatus according to a first embodiment of the present invention. The semiconductor manufacturing apparatus illustrated includes a wafer hand 2 for holding, by vacuum attraction, a wafer 3 (exposure substrate) onto which a semiconductor pattern is to be printed, a fixing support pillar 1 for fixedly supporting the wafer hand 2, a connection 4 for connecting the fixing pillar 1 and a scan guide 12, sensor light projecting means 9 and sensor light receiving means 10 for detecting the position of the wafer 3 with respect to Z direction, from the opposite sides thereof, a fixing table 7 for fixedly holding a wafer carrier 8 (substrate transfer and container means), and driving means 5 for moving the table 7 in Z direction along a guide 6. The pillar 1 is made rotationally movable by means of a driving mechanism (not shown) provided within it. The sensor light projecting means 9 is movable in Z direction along a sensor guide 13. The sensor light receiving means 10 is disposed opposed to the sensor light projecting means 9, with the wafer 3 intervening therebetween. The sensor light receiving means 10 is movable in synchronism with the sensor light projecting means 9, in Z direction along a sensor guide 14.

Figure 2:
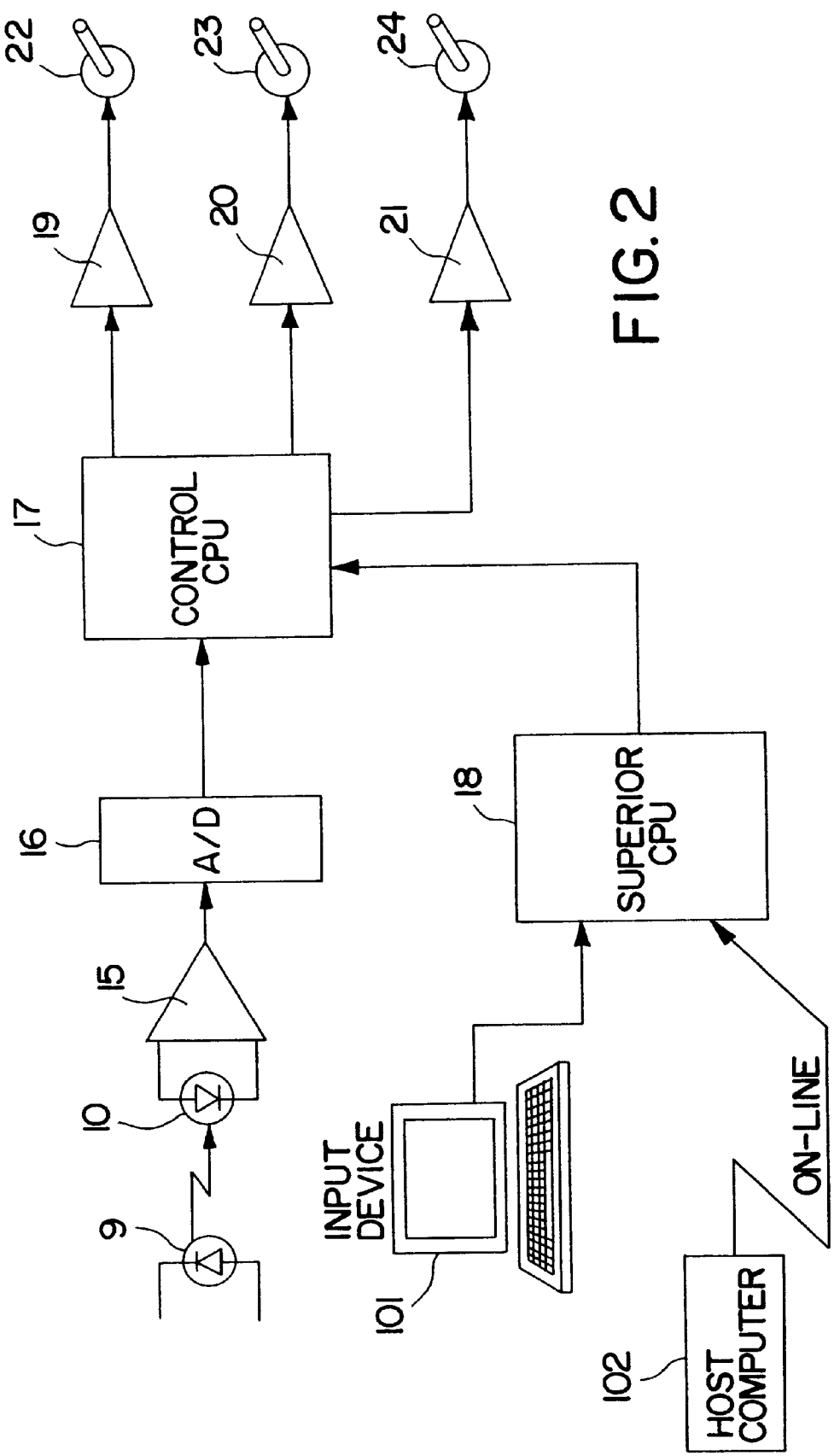
FIG. 2 is a block diagram of an electric system of the apparatus of FIG. 1.

FIG. 2 is a block diagram of the electric system of the apparatus of FIG. 1.

As shown in FIG. 2, the electric system includes an amplifier 15 for amplifying an output of the sensor light receiving means 10 for receiving light from the sensor light projecting means 9, and an analog-to-digital converter 16 for analog-to-digital converting the output of the amplifier 15. The system further includes a superior CPU 18 for supplying control signals related to wafer conveyance in accordance with this embodiment, and a CPU 17 for receiving digital data from the sensor 9 or 10 and data from the superior CPU 18 to perform various control operations. The system further includes a motor 22 for moving the sensor light receiving means 10 and sensor light projecting means 9 in Z direction, a driver 19 for actuating the motor 22, a motor 23 for moving the table 7 in Z direction along the guide 6, a driver 20 for actuating the motor 23, a motor 24 for moving the pillar 1, fixedly supporting the wafer hand 2, in horizontal direction toward the carrier 8, and a driver 21 for actuating the motor 24.

The superior CPU 18 is connected to an input device 101 so that numerical data inputted by an operator can be applied to the superior CPU. The CPU 18 is connected also to a host computer 102, so that numerical data set by the host computer can be applied to the CPU 18. Whether the data inputted by the operator or the data set by the host computer 102 should be used, is determined in accordance with the setting at the input device 101.

Figure 3:
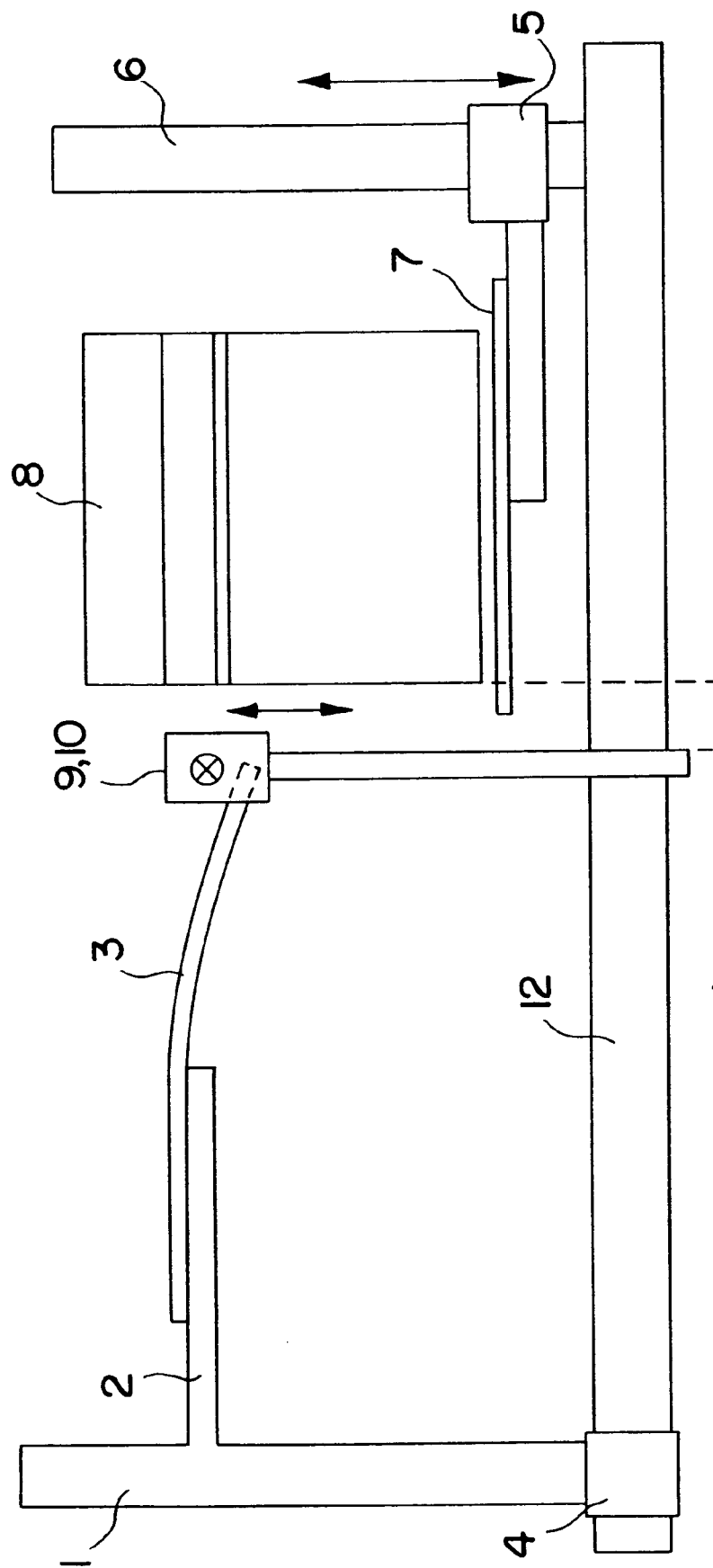
FIG. 3 is a schematic view for explaining a positional relation between a substrate and a sensor in the apparatus of FIG. 1.

FIG. 3 illustrates the positional relation between the sensors and the wafer, in the structure of FIG. 1.

The operation of the apparatus will be described below, in conjunction with FIGS. 1, 2 and 3.

In the semiconductor manufacturing apparatus of FIG. 1, when a wafer is to be conveyed into a particular slot of the wafer carrier 8, the CPU 17 produces a driving signal in accordance with flexure amount data, supplied thereto from the host computer 102 or the input device 101 via the CPU 18, and with command data from the superior CPU 18, and it applies the produced signal to the driver 21 of the motor 24 to move the pillar 1. Here, description will be made on an example wherein a wafer is to be conveyed into a third slot of the wafer carrier 8.

In response to a control signal from the CPU 17, the hand 21 on the pillar 1 unloads a wafer 3 from a separate unit (not shown) of the semiconductor manufacturing apparatus. While the unloaded wafer 3 is being carried on the hand 2, the pillar 1 moves toward the carrier 8. As the forward edge of the wafer 3 passes between the sensor light receiving means 10 and the sensor light projecting means 9, the CPU 17 applies a driving signal to the driver 19 to produce motion of the sensor light receiving means 10 and the sensor light projecting means 9 in Z direction.

As the sensor light receiving means 10 and the sensor light projecting means 9 move in Z direction, the forward edge of the wafer 3 is detected. An output signal from the sensor light receiving means 10 is amplified by the amplifier 15 in accordance with the input range of the analog-to-digital converter 16, and it is supplied to the converter 16. The analog-to-digital converter 16 then converts the received analog signal into a digital signal which is then applied to the CPU 17.

The CPU 17 compares the applied digital signal with a signal having been outputted to the driver 19, and calculates the current position of the wafer 3 with respect to Z direction. Also, simultaneously therewith, it calculates a largest value and smallest value of the wafer 3 in Z direction, from the data outputted by the sensor light receiving means 10.

On the basis of the results of calculation of the maximum and minimum in Z direction, the CPU 17 examines the Z-axis position of the wafer 3 as a whole, the Z-axis position of the forward edge of the wafer 3, and the amount of flexure of the substrate. If the amount of flexure is large as compared with the flexure amount data supplied from the host computer 102 or input device 101 via the CPU 18, the CPU 17 concludes the possibility of interference at the wafer carrier 8 and thus it applies a stop signal to the driver 21 for the motor 24, to stop the motor 24 for moving the pillar 1 in horizontal direction. In response to the stop signal, the driver 21 stops the motor 24 which is moving the pillar 1.

If the amount of flexure is small as compared with flexure amount data supplied from the host computer 102 or input device 101 via the CPU 18, the CPU 17 calculates the position of the wafer carrier 8 with respect to Z direction, and produces a driving signal to the driver 20 so that the position of the forward edge of the wafer 3 in Z direction comes to the same level as the third slot position of the wafer carrier 8. In response to this driving signal, the driver 20 actuates the motor 23, for moving the table 7 on which the wafer carrier 8 is mounted. Further, while carrying the wafer 3 on the hand 2, the pillar 1 moves toward the carrier 8. In synchronism with this motion of the pillar 1, the CPU 17 moves the sensor light receiving means 10 and the sensor light projecting means 9 in Z direction, for detecting the side edge portion of the wafer 3.

During conveyance of the wafer 2 toward the carrier 8 while being carried on the hand 2, the CPU 17 calculates the signal or data from the sensor light receiving means 10, as well as the data concerning the movement amount of the pillar 1 and movement amounts in Z direction of the sensor light receiving means 10 and sensor light projecting means 9, to examine whether the wafer carrier 8 and the wafer 3 are brought into interfering positional relation or not. If a positional deviation larger than a predetermined data concerning this positional relation is detected. the movement operation is stopped in accordance with the same sequence as the stopping operation for the pillar 1 described above.

[Second Embodiment]

Figure 4:
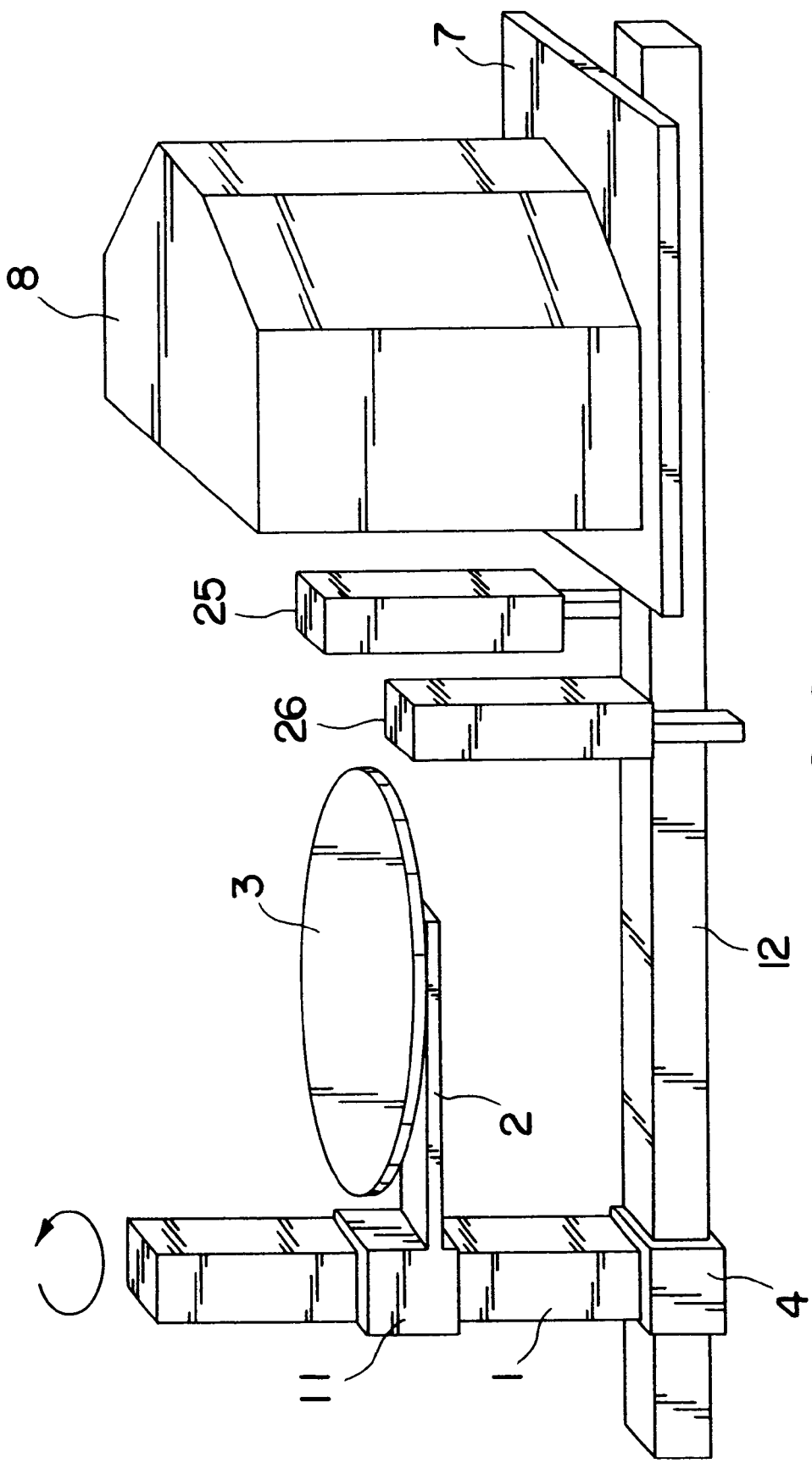
FIG. 4 is a perspective view of a main portion of a semiconductor manufacturing apparatus according to a second embodiment of the present invention.

FIG. 4 is a schematic view of a semiconductor manufacturing apparatus according to a second embodiment of the present invention. The second embodiment shown in FIG. 4 differs from the first embodiment of FIG. 1 in that the Z-axis moving means 11 is not annexed to the carrier 8 and the carrier fixing table 7 but it is mounted on the substrate fixing pillar 1; that the motor 23 shown in FIG. 2 functions as a motor for moving the moving means 11 on the fixing pillar 1; that the driver for actuating the motor 23 of FIG. 2 functions as a driver 20; that the sensor light receiving means 10 and the sensor light projecting means 9 are replaced by line sensor light receiving means 25 and line sensor light projecting means 26 having no driving means; and that the motor 22 of FIG. 2 for moving the sensor light receiving means 9 and the driver 19 for actuating the motor 22 are omitted.

The operation of the apparatus of this embodiment will be described in conjunction with FIGS. 4 and 5.

Figure 5:
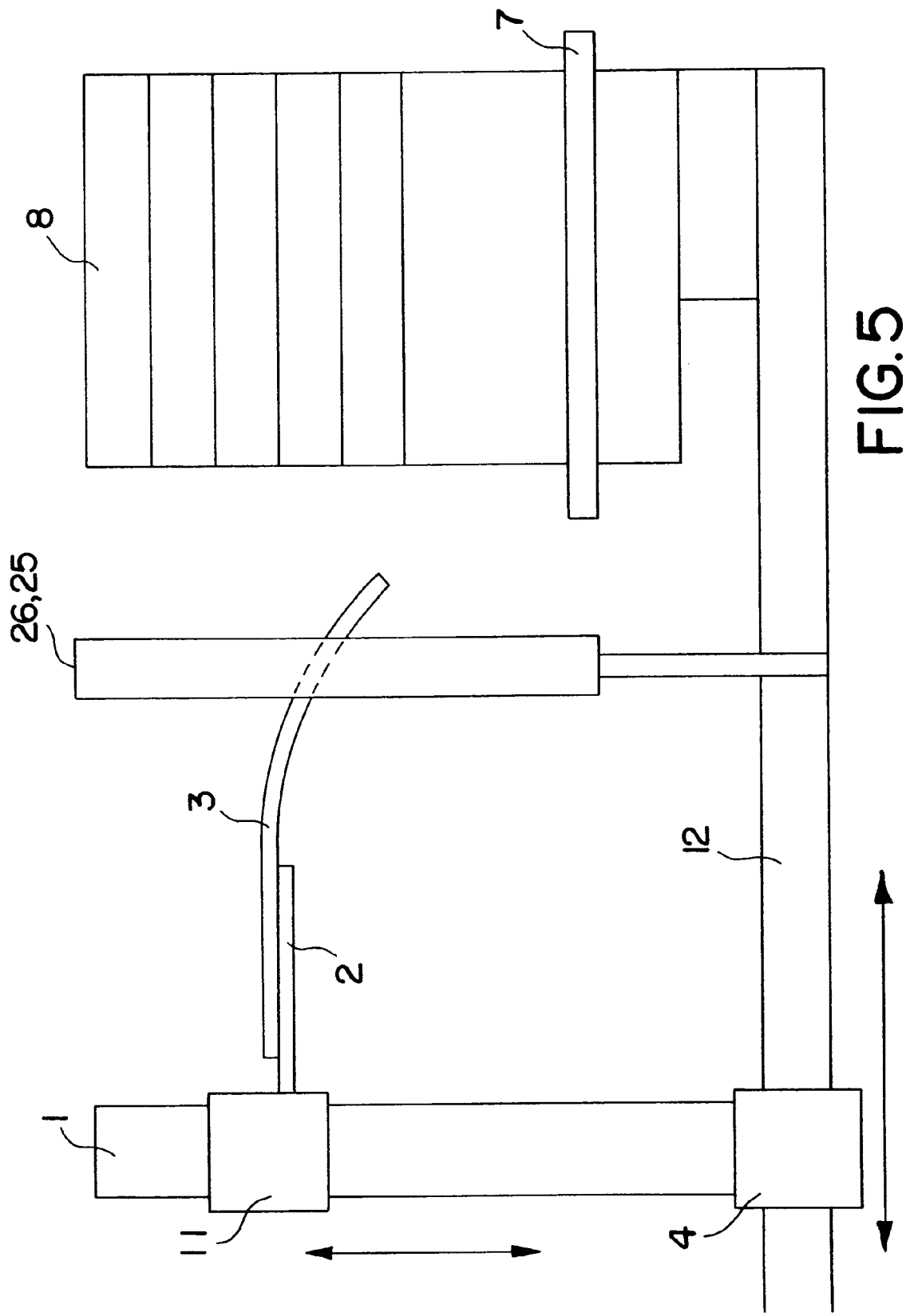
FIG. 5 is a schematic view for explaining a positional relation between a sensor and a wafer, in the apparatus of FIG. 4.

FIG. 5 illustrates the positional relation between a wafer and sensors, in the semiconductor manufacturing apparatus according to this embodiment.

When, in the semiconductor manufacturing apparatus of this embodiment, like the first embodiment, a substrate is to be conveyed into a particular slot of a wafer carrier, the CPU 17 produces a driving signal in accordance with flexure amount data, supplied thereto from the host computer 102 or the input device 101 via the CPU 18, and with command data from the superior CPU 18, and it applies the produced signal to the driver 21 of the motor 24 and to the driver 20 of the motor 23, to move the pillar 1 in horizontal direction and vertical direction, respectively. Here, description will be made on an example wherein a wafer is to be conveyed into a fifth slot of the wafer carrier.

In response to a control signal from the CPU 17, the hand 2 is moved to the topmost position in the vertical direction. The hand 2 of the fixing pillar 1 unloads a wafer 3 from a separate unit (not shown) of the semiconductor manufacturing apparatus. While the unloaded wafer 3 is being carried on the hand 2, the pillar 1 moves toward the carrier 8.

As the forward edge of the wafer 3 passes between the line sensor light receiving means 25 and the line sensor light projecting means 26, the line sensor light receiving means 25 detects the position of the forward edge of the wafer 3 in Z direction.

An output signal from the line sensor light receiving means 25 is amplified by the amplifier 15 in accordance with the input range of the analog-to-digital converter 16, and it is applied to the converter 16. The analog-to-digital converter 16 then converts the received analog signal into a digital signal which is then applied to the CPU 17. On the basis of the thus applied digital signal, the CPU 17 calculates the a largest value and a smaller value of the current position of the whole wafer 3 in Z direction.

On the basis of the results of calculation of the maximum and minimum of Z-axis position of the whole wafer 3, the CPU 17 examines the Z-axis position of the wafer 3 as a whole, the Z-axis position of the forward edge of the wafer 3, and the amount of flexure of the substrate. If the amount of flexure is large as compared with the flexure amount data supplied from the host computer 102 or input device 101 via the CPU 18, the CPU 17 concludes the possibility of interference at the wafer carrier 8 and thus it applies a stop signal to the driver 21 for the motor 24, to stop the motor 24 for moving the pillar 1.

In response to the stop signal, the driver 21 stops the motor 24 which is moving the pillar 1.

If the amount of flexure is small as compared with flexure amount data supplied from the host computer 102 or input device 101 via the CPU 18, the CPU 17 calculates the position of the wafer 3 with respect to Z direction, and produces a driving signal to the driver 20 so that the position of the forward edge of the wafer 3 in Z direction comes to the same level as the fifth slot position of the wafer carrier 8.

In response to this driving signal, the driver 20 actuates the motor 23, for moving the Z-axis moving means 11 of the band 2.

Further, while carrying the wafer 3 on the hand 2, the pillar 1 moves toward the carrier 8. In synchronism with this motion of the pillar 1, the CPU 17 detects the side edge portion of the wafer 3 on the basis of an output signal from the line sensor light receiving means 25. During conveyance of the wafer 3, the CPU 17 calculates the signal or data from the line sensor light receiving means 25, as well as the data concerning the movement amount of the pillar 1, to examine whether the fifth slot position and the Z-axis position of the forward edge of the wafer 3 are brought into interfering positional relation or not. If a positional deviation larger than a predetermined data concerning this positional relation is detected, the movement operation is stopped in accordance with the same sequence as the stopping operation for the pillar described above.

[Third Embodiment]

Figure 6:
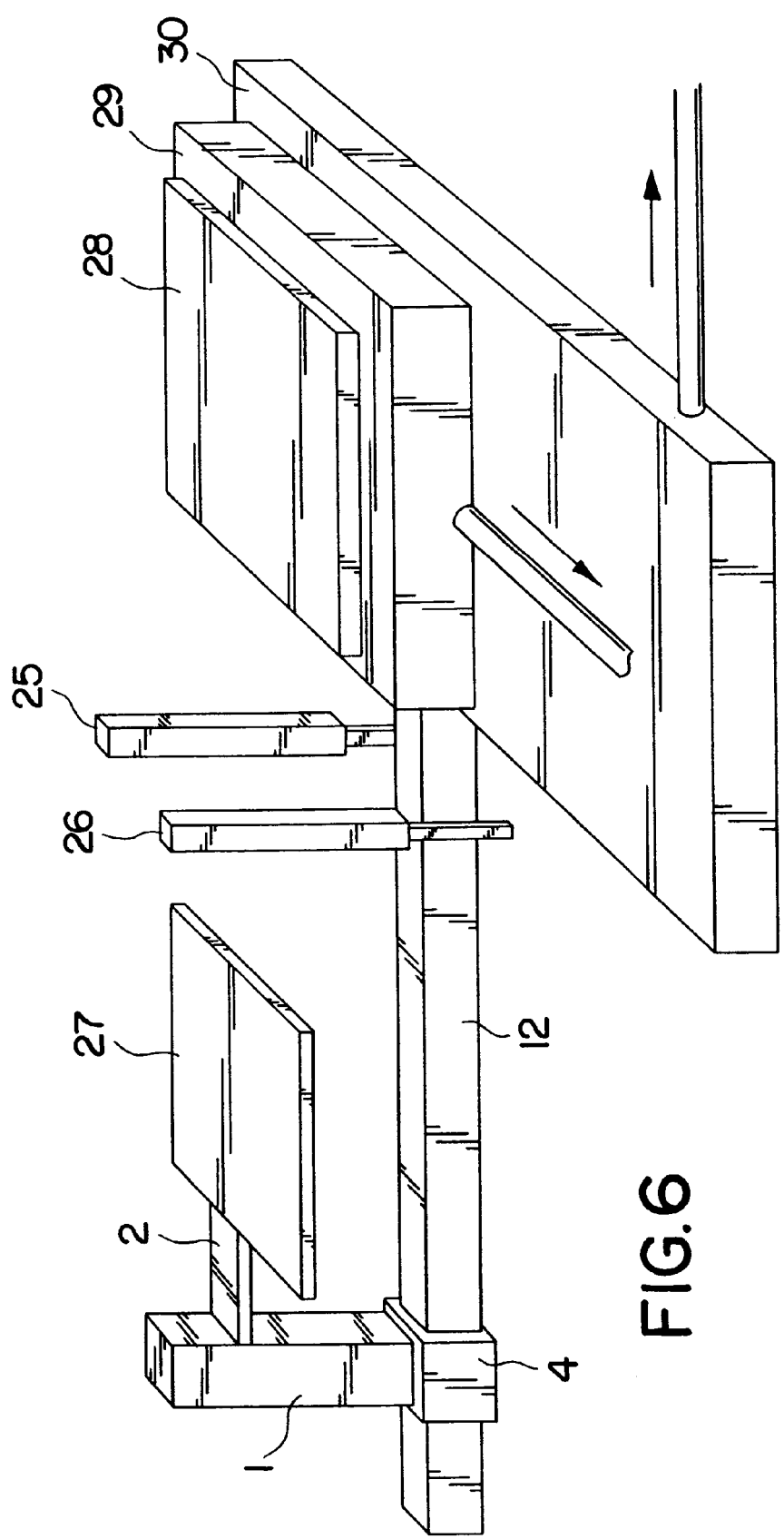
FIG. 6 is a perspective view of a main portion of a liquid crystal plate manufacturing apparatus, according to a third embodiment of the present invention.
Figure 7:
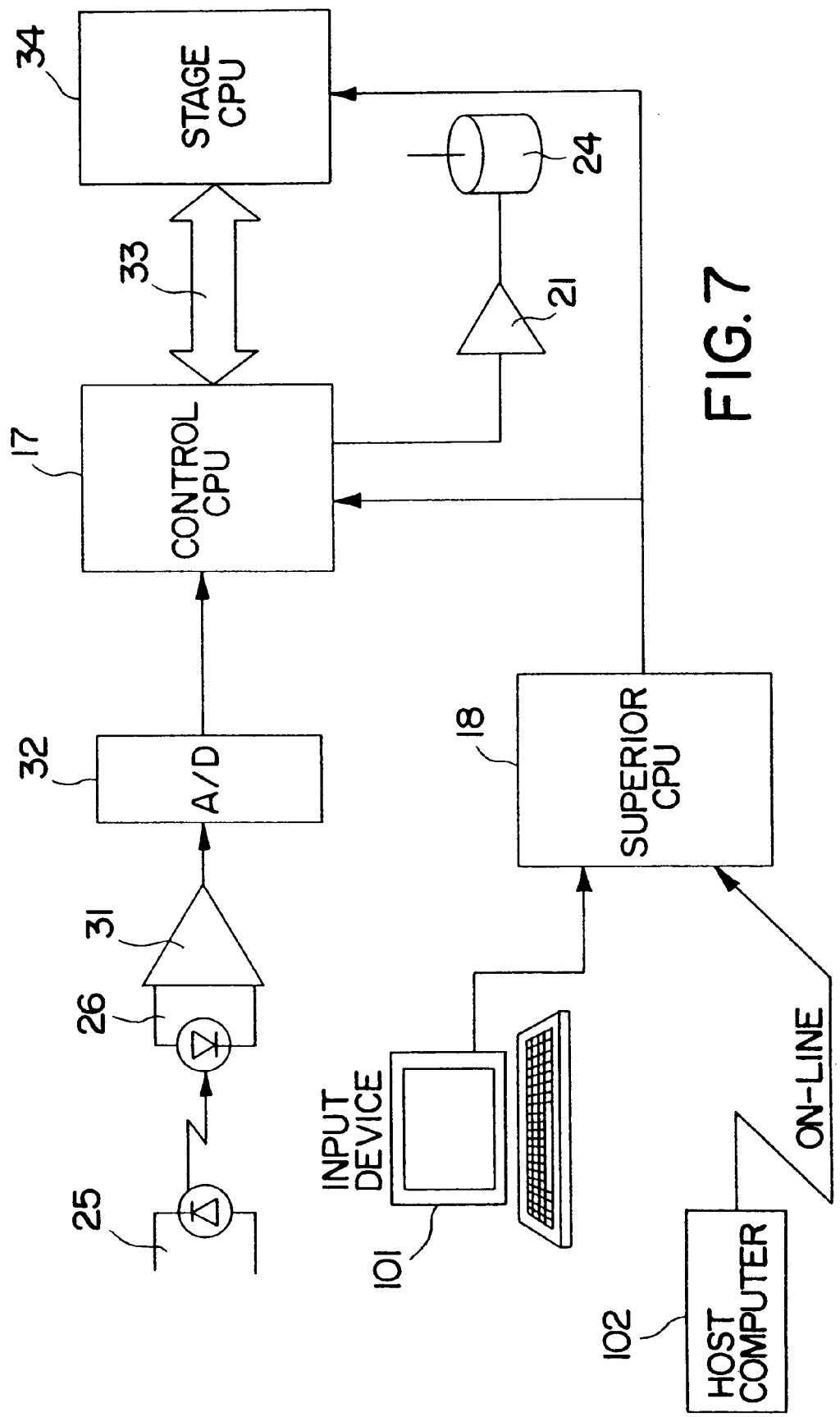
FIG. 7 is a block diagram of an electric system of the apparatus of FIG. 6.

FIG. 6 is a schematic view of a liquid crystal plate manufacturing apparatus according to a third embodiment of the present invention. FIG. 7 is a block diagram of an electric system of the apparatus of FIG. 6. While the first and second embodiments have been described with reference to examples of conveyance of a wafer as an exposure substrate, the third embodiment is applied to conveyance of a liquid crystal plate as an exposure substrate.

Recently, the size of a liquid crystal plate is increasing more and more, and flexure or the like of the plate itself is large. The present invention therefore provides a significant advantageous effect to it.

The third embodiment shown in FIG. 6 differs from the first and second embodiments of FIGS. 1 and 4 in that the article to be conveyed is a large size liquid crystal plate 27, and that the transfer means for transferring the liquid crystal plate comprises a plate chuck 28 having a Z-axis moving mechanism. The plate chuck 28 is mounted on a Y stage 29 of an X-Y stage, while the plate chuck 28 and the Y stage 29 are mounted on an X stage 30.

In the block diagram of electric system, although in the first and second embodiments the CPU 17 applies driving signals to the motors 22–24 and drivers 19–21, in this embodiment the outputs to motors 22–23 and drivers 19–20, among these driving signals, are replaced by data transfer to a separate unit or units.

In this embodiment, maximum value and minimum value data as measured by the line sensor 26 is processed by the CPU 17 and, from the thus processed data, the Z-axis position of the liquid crystal plate as a whole and the Z-axis position of the forward edge of the liquid crystal plate are detected. Then, on the basis of the results of calculation, the CPU 17 examines the flexure amount of the liquid crystal plate 27.

If the amount of flexure is large as compared with the flexure amount data supplied from the host computer 102 or input device 101 via the CPU 18, the CPU 17 concludes the possibility of interference at the plate chuck 28 and thus it applies a stop signal to the driver 21 for the motor 24 to stop the motor 24 for moving the pillar 1. In response to the stop signal, the driver 21 stops the motor 24 which is moving the pillar 1.

If the amount of flexure is small as compared with flexure amount data supplied from the host computer 102 or input device 101 via the CPU 18, the CPU 17 calculates the position of the plate chuck 28 with respect to Z direction, and supplies a driving data to a stage controlling CPU 34 so that the position of the forward edge of the plate 27 in Z direction comes to the same level as the position of the plate chuck 28.

Further, while carrying the plate 27 on the hand 2, the pillar 1 moves toward the plate chuck 28. In synchronism with this motion of the pillar 1, the CPU 17 detects the side edge portion of the plate 27 on the basis of an output signal from the line sensor light receiving means 25. During conveyance of the plate 27, the CPU 17 calculates the signal or data from the line sensor light receiving means 25, as well as the data concerning the movement amount of the pillar 1, to examine whether the chuck 28 and the plate 27 are brought into interfering positional relation or not. If a positional deviation larger than a predetermined data concerning this positional relation is detected, the movement operation is stopped in accordance with the same sequence as the stopping operation for the pillar described above.

[Fourth Embodiment]

In the embodiments described hereinbefore, if the wafer 3 and the wafer carrier 8 or if the liquid crystal plate 27 and the plate chuck 28 are in interfering relation with each other, conveyance of the wafer 3 or the plate 27 is stopped. In the fourth to sixth embodiments to be described below, the vertical position of the wafer carrier 8 or plate chuck 28 is so controlled as to avoid occurrence of such interfering relation.

The fourth embodiment uses the same structure as of the first embodiment, but it differs from the latter in the sequence (program) to be executed by the CPU 17.

Referring to FIGS. 1, 2 and 8, the operation of the apparatus according to this embodiment will be described. In the semiconductor manufacturing apparatus of this embodiment, when a wafer is to be conveyed into a particular slot of the wafer carrier, the CPU 17 produces a driving signal in accordance with command data supplied from the superior CPU 18, and it applies the produced signal to the driver 21 of the motor 24 to move the pillar 1. Here, description will be made on an example wherein a wafer is to be conveyed into a third slot of the wafer carrier 8.

In response to a control signal from the CPU 17, the hand 2 on the pillar 1 unloads a wafer 3 from a separate unit (not shown) of the semiconductor manufacturing apparatus. While the unloaded wafer 3 is being carried on the hand 2, the pillar 1 moves horizontally toward the carrier 8. As the forward edge of the wafer 3 passes between the sensor light receiving means 10 and the sensor light projecting means 9, the CPU 17 applies a driving signal to the driver 19 to produce motion of the sensor light receiving means 10 and the sensor light projecting means 9 in Z direction. As the sensor light receiving means 10 and the sensor light projecting means 9 move in Z direction, the forward edge of the wafer 3 is detected. An output signal from the sensor light receiving means 10 is amplified by the amplifier 15 in accordance with the input range of the analog-to-digital converter 16, and it is applied to the converter 16. The analog-to-digital converter 16 then converts the received analog signal into a digital signal which is then applied to the CPU 17. The CPU 17 compares the applied digital signal with a signal having been outputted to the driver 19, and calculates a largest value and smallest value of the current position of the wafer 3 with respect to Z direction.

On the basis of the results of calculation of the maximum and minimum of the Z-direction position of the wafer 3, the CPU 17 examines the Z-axis position of the wafer 3 as a whole, the Z-axis position of the forward edge of the wafer 3, and the amount of flexure of the substrate. On the other hand, the CPU 17 calculates the Z-axis position of the wafer carrier 18, and produces a driving signal to the driver 20 so that the third slot position of the wafer carrier 8 comes to the same level as the Z-axis position of the forward edge of the wafer 3. In response to this driving signal, the driver 20 actuates the motor 23 for moving the table 7 on which the wafer carrier 8 is mounted.

Further, while carrying the wafer 3 on the hand 2, the pillar 1 moves toward the carrier 8.

In synchronism with this motion of the pillar 1, the CPU 17 moves the sensor light receiving means 10 and the sensor light projecting means 9 in Z direction, for detecting the side edge portion of the wafer 3.

The CPU 17 calculates the signal or data from the sensor light receiving means 10, as well as the data concerning the movement amount of the pillar 1 and movement amounts in Z direction of the sensor light receiving means 10 and sensor light projecting means 9, and continuously supplies a driving signal to the driver 20 so that the third slot position and the position of the wafer 3 with respect to the Z direction come to the same level.

Figure 8A:
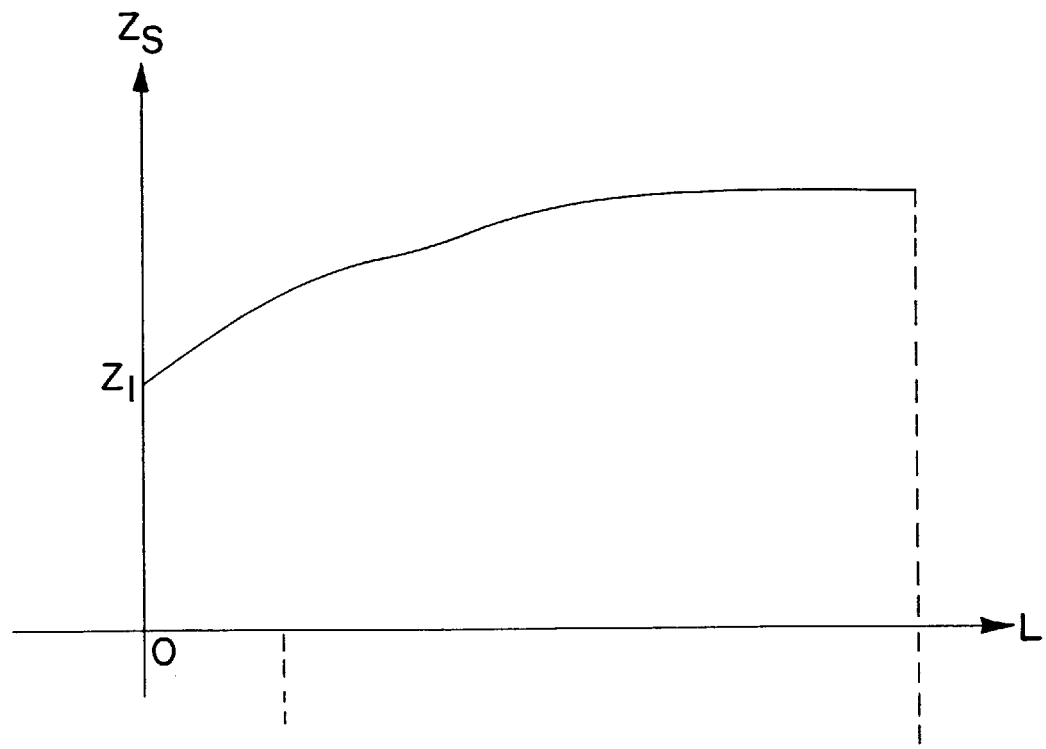
FIG. 8 is a schematic view for explaining the relation among the position of sensor detecting means, the wafer movement amount and the position of a fixed table, in the apparatus of FIG. 1.
Figure 8B:
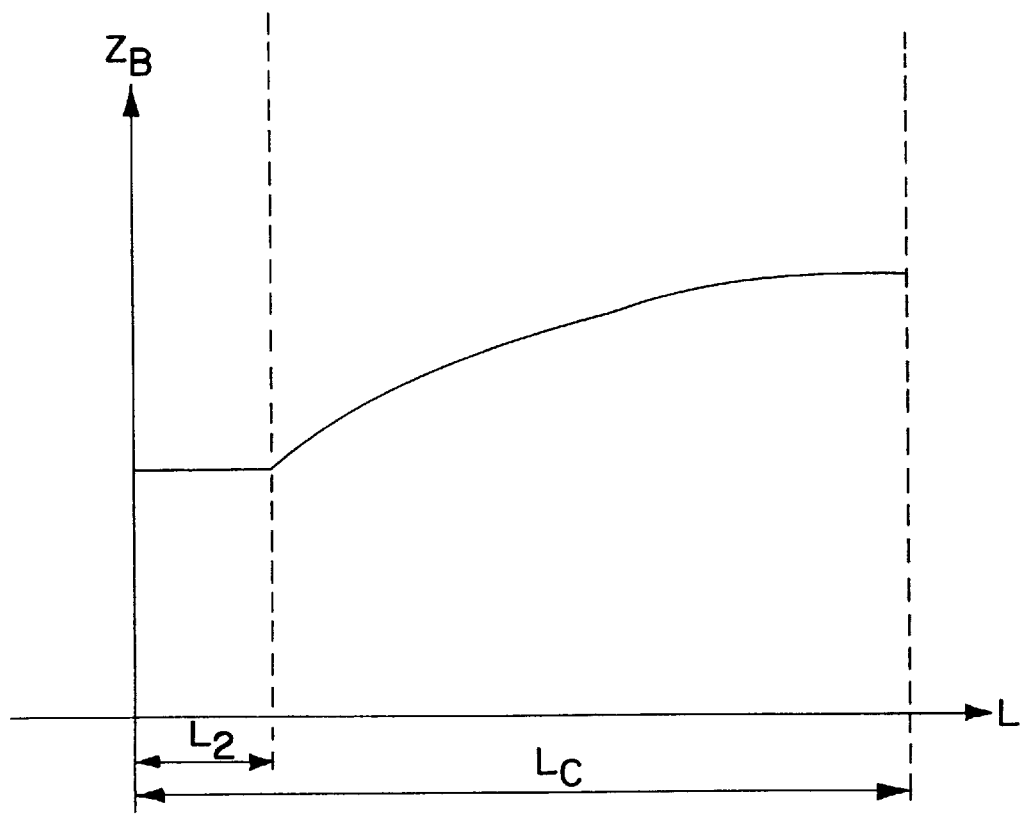

The graphs at (a) and (b) in FIG. 8 illustrate this operation. FIG. 8(a) shows the relation between the Z-axis position $Z_S$ of the sensor detection means (9, 10) for detecting the wafer 3 and the movement amount L of the wafer 3, as the position of the sensor detection means (9, 10) is taken as zero. FIG. 8(b) shows the relation between the movement amount L of the wafer 3 and the Z-axis position $Z_B$ of the table 7 required therefor, as the position of the sensor detection means (9, 10) is taken as zero. Denoted at $L_2$ in FIG. 8(b) is the difference in position along horizontal direction between the sensor detection means (9, 10) and the wafer carrier 8, and denoted at $L_C$ is a normal maximum movement amount of the pillar 1.

On the basis of the signal or data from the sensor light receiving means 10 as well as movement amount L of the pillar 1 and movement amounts of the sensor light receiving means 10 and the sensor light projecting means 9 in Z direction, as shown in the graph of FIG. 8(a), the position of the wafer 3 in Z direction can be calculated. From the result of calculation, CPU 17 determines the Z-axis position $Z_B$ of the table 7 having the wafer carrier 8 mounted, and it moves the table 7 to that position.

As described above, the CPU 17 moves the sensor light receiving means 10 and the sensor light projecting means 9 in Z direction so as to continuously detect the side edge portion of the wafer 3. Further, it calculates the signal or data from the sensor light receiving means 10 as well as the movement amount of the pillar 1 and the movement amounts of the sensor light receiving means 10 and the sensor light projecting means 9 in Z direction. While controlling the table 7 having the wafer carrier 8 mounted so that the third slot position comes to the same level as the Z-axis position of the wafer 3, it conveys the wafer 3 into the wafer carrier 8.

[Fifth Embodiment]

The fifth embodiment uses the same structure as of the second embodiment shown in FIGS. 4 and 5, but the sequence to be executed by CPU 17 differs from that of the second embodiment.

The fifth embodiment of the present invention will be described with reference to FIGS. 4 and 5.

The fifth embodiment differs from the fourth embodiment in that the Z-axis moving means 11 is not annexed to the carrier 8 and the carrier fixing table 7 but it is mounted on the substrate fixing pillar 1; that the motor 23 shown in FIG. 2 functions as a motor for moving the moving means 11 on the fixing pillar 1; that the driver for actuating the motor 23 of FIG. 2 functions as a driver 20; that the sensor light receiving means 10 and the sensor light projecting means 9 are replaced by line sensor light receiving means 25 and line sensor light projecting means 26 having no driving means; and that the motor 22 of FIG. 2 for moving the sensor light receiving means 10 and the sensor light projecting means 9 and the driver 19 for actuating the motor 22 are omitted.

The operation of the apparatus of this embodiment will be described in conjunction with FIGS. 4 and 5.

When, in the semiconductor manufacturing apparatus of this embodiment, like the fourth embodiment, a substrate is to be conveyed into a particular slot of a wafer carrier, the CPU 17 produces a driving signal in accordance with command data from the superior CPU 18, and it applies the produced signal to the driver 21 of the motor 24 and to the driver 20 of the motor 23, to move the pillar 1 in horizontal direction and vertical direction, respectively. Here, description will be made on an example wherein a wafer is to be conveyed into a fifth slot of the wafer carrier.

In response to a control signal from the CPU 17, the hand 2 is moved to the topmost position in the vertical direction. The hand 2 of the fixing pillar 1 unloads a wafer 3 from a separate unit (not shown) of the semiconductor manufacturing apparatus. While the unloaded wafer 3 is being carried on the hand 2, the pillar 1 moves toward the carrier 8.

As the forward edge of the wafer 3 passes between the line sensor light receiving means 25 and the line sensor light projecting means 26, the line sensor light receiving means 25 detects the position of the forward edge of the wafer 3 in Z direction.

An output signal from the line sensor light receiving means 25 is amplified by the amplifier 15 in accordance with the input range of the analog-to-digital converter 16, and it is applied to the converter 16. The analog-to-digital converter 16 then converts the received analog signal into a digital signal which is then applied to the CPU 17. On the basis of the thus applied digital signal, the CPU 17 calculates the a largest value and a smallest value of the current position of the whole wafer 3 in Z direction.

On the basis of the results of calculation of the maximum and minimum of Z-axis position of the whole wafer 3, the CPU 17 examines the Z-axis position of the wafer 3 as a whole, the Z-axis position of the forward edge of the wafer 3, and the amount of flexure of the substrate, and it produces a driving signal to the driver 20 so that the position of the forward edge of the wafer 3 in Z direction comes to the same level as the fifth slot position of the wafer carrier 8. In response to this driving signal, the driver 20 actuates the motor 23, for moving the Z-axis moving means 11 of the hand 2.

Further, while carrying the wafer 3 on the hand 2, the pillar 1 moves toward the carrier 8. In synchronism with this motion of the pillar 1, the CPU 17 detects the side edge portion of the wafer 3 on the basis of an output signal from the line sensor light receiving means 25. The CPU 17 calculates the signal or data from the line sensor light receiving means 25, as well as the data concerning the movement amount of the pillar 1, and it continuously applies a driving signal to the driver 20 so that the fifth slot position and the Z-axis position of the wafer 3 come to the same level.

As described above, the CPU 17 continuously detects the side edge portion of the wafer 3, and calculates the data concerning the movement amount of the pillar 1. Then, while controlling the hand 2 having the wafer 3 carried thereon so that the fifth slot position comes to the same level as the Z-axis position of the wafer 3, it conveys the wafer 3 into the wafer carrier 8.

[Sixth Embodiment]

The sixth embodiment uses the same structure as of the third embodiment shown in FIG. 6, but the sequence to be executed by the CPU 17 differs from that of the third embodiment.

Referring to FIGS. 6 and 7, the sixth embodiment of the present invention will be described. Although the fourth and fifth embodiments are directed to conveyance of a wafer, this embodiment relates to conveyance of a liquid crystal plate.

Recently, the size of a liquid crystal plate is increasing more and more, and flexure or the like of the plate itself is large. The present invention therefore provides a significant advantageous effect to it.

The sixth embodiment differs from the fourth and fifth embodiments in that the article to be conveyed is a large size liquid crystal plate 27, and that the transfer means for transferring the liquid crystal plate comprises a plate chuck 28 having a Z-axis moving mechanism. The plate chuck 28 is mounted on a Y stage 29 of an X-Y stage, while the plate chuck 28 and the Y stage 29 are mounted on an X stage 30.

In the block diagram of electric system, although in the fourth and fifth embodiments the CPU 17 applies driving signals to the motors 22–24 and drivers 19–21, in this embodiment the outputs to motors 22–23 and drivers 19–20, among these driving signals, are replaced by data transfer to a separate unit or units.

In this embodiment, the data as measured by the line sensor 26 is processed by the CPU 17. But, driving signals are not applied to the drivers 19–20. Rather, on the basis of the processed data, the Z-axis position of the plate chuck as a whole, the Z-axis position of the forward edge thereof and the flexure amount are detected. Then, the positional information is outputted to a CPU 34 for controlling the X-Y stage, via a data bus 33. The CPU 34 for X-Y stage control operates on the basis of the thus applied data, to move the plate chuck 28 beforehand to its proper position, containing the flexure amount, such that the chuck can receive the liquid crystal plate from the hand 2.

As described above, since during conveyance the vertical positions of the substrate and of the hand are detected, if a substrate being conveyed has warp or flexure, the substrate conveyance can be stopped. Thus, interferences of the substrate and the substrate transfer means can be avoided. This effectively prevents malfunction of the apparatus, and reduces the time for maintenance.

Further, detection of the vertical positions of the substrate and of the hand enables correction of the positional relation between the substrate and the substrate container means in vertical direction, such that the substrate can be stored into the wafer carrier of the container means safely. This effectively reduces the inoperative time of the apparatus and thus increases the operation efficiency of the apparatus.

Further, as described with reference to the sixth embodiment, the chuck on the stage can be moved beforehand. This leads to an increase of throughput or of processing capacity of the apparatus.

In accordance with the embodiments of the present invention as described hereinbefore, even if the flexure of substrates to be conveyed is dispersive, interference during transportation, damage of substrates due to the interference, or malfunction of the apparatus can be prevented. This effectively reduces the necessity of repair work of the apparatus by an operator and of the maintenance load. The throughput and productivity can be enlarged significantly.

While the invention has been described with reference to the structures disclosed herein, it is not confined to the details set forth and this application is intended to cover such modifications or changes as may come within the purposes of the improvements or the scope of the following claims.

What is claimed is:

1. A substrate conveying system, comprising:
   a conveying mechanism for conveying a substrate;
   a sensor being movable independently of the conveyance of the substrate, for producing positional information related to the substrate during the conveyance of the substrate, whereby different amounts of flexure of different substrates can be detected;
   control means for controlling the substrate conveying operation on the basis of the produced information.

2. A system according to claim 1, wherein the substrate conveying operation is stopped in accordance with the information.

3. A system according to claim 2, wherein said sensor is serviceable to detect a maximum amount and a minimum amount of flexure of the substrate, and wherein the substrate conveying operation is stopped when a difference between these amounts becomes larger than a predetermined value.

4. A system according to claim 1, further comprising means for specifying data from an operator, connected to said control means, wherein the substrate conveying operation is controlled in accordance with the information and data as specified by an operator with said specifying means.

5. A system according to claim 1, further comprising superior host control means, wherein the substrate conveying operation is controlled in accordance with the information and data supplied from the superior host control means of said substrate conveying system.

6. A system according to claim 1, wherein said control means is operable to adjust relative positional relation between the substrate and substrate transfer means.

7. A system according to claim 6, wherein said conveying mechanism moves the substrate in a lateral direction.

8. A system according to claim 6, wherein the substrate and the substrate transfer means are relatively moved relative to each other, in a longitudinal direction, in accordance with the information.

9. A system according to claim 8, wherein said conveying mechanism moves the substrate in a longitudinal direction.

10. A system according to claim 8, wherein substrate transfer means is movable in a longitudinal direction.

11. A system according to claim 6, wherein the substrate transfer means comprises a carrier for accommodating plural wafers therein.

12. A system according to claim 6, wherein said sensor is disposed adjacent the substrate transfer means.

13. A system according to claim 1, wherein said sensor is movable in a longitudinal direction.

14. A system according to claim 1, wherein said sensor comprises an optical sensor.

15. A system according to claim 1, wherein the substrate comprises a substrate to be treated by an exposure process.

16. A substrate conveying system, comprising:
   a container for accommodating a substrate therein and being movable;
   a sensor being movable independently of the movement of said container, and for producing positional information related to the substrate during conveyance of the substrate, whereby different amounts of flexure of different substrates can be detected; and
   a controller for controlling the substrate conveying operation on the basis of the produced information.

17. A system according to claim 16, wherein the substrate conveying operation is stopped in accordance with the information.

18. A system according to claim 17, wherein said sensor is serviceable to detect a maximum amount and a minimum amount of flexure of the substrate, and wherein the substrate conveying operation is stopped when a difference between these amounts becomes larger than a predetermined value.

19. A system according to claim 16, further comprising means for specifying data from an operator, connected to said controller, wherein the substrate conveying operation is controller in accordance with the information and data as specified by an operator with said specifying means.

20. A system according to claim 16, further comprising a superior host control means, wherein the substrate conveying operation is controlled in accordance with the information and data supplied from the superior host control means of said substrate conveying system.

21. A system according to claim 16, wherein said controller is operable to adjust the relative positional relation between the substrate and substrate transfer means.

22. A system according to claim 21, wherein said container moves the substrate in a lateral direction.

23. A system according to claim 21, wherein the substrate and the substrate transfer means are moved relative to each other, in a longitudinal direction, in accordance with the information.

24. A system according to claim 23, wherein said container moves the substrate in a longitudinal direction.

25. A system according to claim 23, wherein the substrate transfer means is movable in a longitudinal direction.

26. A system according to claim 21, wherein the substrate transfer means comprises a carrier for accommodating plural wafers therein.

27. A system according to claim 21, wherein said sensor is disposed adjacent the substrate transfer means.

28. A system according to claim 16, wherein said sensor is movable in a longitudinal direction.

29. A system according to claim 16, wherein said sensor comprises an optical sensor.

30. A system according to claim 16, wherein the substrate comprises a substrate to be treated by an exposure process.

* * * * *

UNITED STATES PATENT AND TRADEMARK OFFICE
CERTIFICATE OF CORRECTION

PATENT NO.    : 6,236,904 B1
DATED         : May 22, 2001
INVENTOR(S)   : Gen Nakamura It is certified that error appears in the above-identified patent and that said Letters Patent is hereby corrected as shown below:

Column 4,
Line 52, "on" should read -- of --.

Column 6,
Line 67, "band 2" should read -- hand 2 --.

Column 12,
Line 13, "detected;" should read -- detected; and --.

Column 13,
Line 12, "controller in" should read -- controlled in --.

Signed and Sealed this

Eleventh Day of June, 2002

Attest:

Attesting Officer

JAMES E. ROGAN
Director of the United States Patent and Trademark Office